US009975335B2

(12) United States Patent
Ng et al.

(10) Patent No.: US 9,975,335 B2
(45) Date of Patent: May 22, 2018

(54) ALTERNATIVE GROUND LINES FOR INTER-SLOT GROUNDING

(71) Applicant: HEWLETT-PACKARD DEVELOPMENT COMPANY, L.P., Houston, TX (US)

(72) Inventors: Boon Bing Ng, Singapore (SG); Thida Ma Win, Singapore (SG); Jose Jehrome Rando, Salisbury Downs (AU)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days. days.

(21) Appl. No.: 15/502,588

(22) PCT Filed: Aug. 18, 2014

(86) PCT No.: PCT/US2014/051512
§ 371 (c)(1),
(2) Date: Feb. 8, 2017

(87) PCT Pub. No.: WO2016/028261
PCT Pub. Date: Feb. 25, 2016

(65) Prior Publication Data
US 2017/0225462 A1 Aug. 10, 2017

(51) Int. Cl.
*B41J 2/14* (2006.01)
*H01L 23/528* (2006.01)
(Continued)

(52) U.S. Cl.
CPC ...... *B41J 2/14072* (2013.01); *H01L 23/5226* (2013.01); *H01L 23/5286* (2013.01); *H01L 24/06* (2013.01)

(58) Field of Classification Search
CPC .. B41J 2/14072; H01L 24/06; H01L 23/5286; H01L 23/5226
See application file for complete search history.

(56) References Cited

U.S. PATENT DOCUMENTS 6,123,410 A 9/2000 Beerling
6,188,414 B1 2/2001 Wong
(Continued)

FOREIGN PATENT DOCUMENTS

CN 101163591 4/2008
JP 2002086742 3/2002
(Continued)

OTHER PUBLICATIONS

Sungjune Jung; Fluid Characterisation and Drop Impact in Inkjet Printing for Organic Semiconductor Devices; Apr. 2011; https: www.repository.cam.ac.uk/bitstream/handle/1810/241610/ PhD%20Thesis%20-%20Sungjune%20Jung.pdf?sequence=1.

*Primary Examiner* — Bradley Thies
(74) *Attorney, Agent, or Firm* — HP Inc. Patent Department

(57) ABSTRACT

In an example implementation, a grounding structure includes a perimeter ground line around the perimeter of a printhead die, and having north, south, east, and west segments. The structure includes an inter-slot ground line extending from the north segment to the south segment between two fluid slots, and an alternative ground line extending from the east segment to the west segment and intersecting the inter-slot ground line in a connection area near ends of the fluid slots.

15 Claims, 2 Drawing Sheets

(51) Int. Cl.
*H01L 23/522* (2006.01)
*H01L 23/00* (2006.01)

(56) References Cited

U.S. PATENT DOCUMENTS

| | | |
|---|---|---|
| 6,234,598 B1 | 5/2001 | Torgerson et al. |
| 6,309,053 B1 | 10/2001 | Torgerson et al. |
| 6,478,410 B1 | 11/2002 | Prasad et al. |
| 6,585,352 B1 | 7/2003 | Torgerson |
| 6,981,760 B2 | 1/2006 | Yamamoto |
| 7,195,341 B2 | 3/2007 | King et al. |
| 2002/0149632 A1 | 10/2002 | Parish |
| 2004/0183866 A1* | 9/2004 | Conta .................. B41J 2/14072 347/65 |
| 2006/0125881 A1 | 6/2006 | Kousuke et al. |
| 2008/0273053 A1 | 11/2008 | Takeuchi et al. |
| 2009/0267994 A1 | 10/2009 | Takatoshi et al. |

FOREIGN PATENT DOCUMENTS

| | | |
|---|---|---|
| JP | 2004-505818 | 2/2004 |
| JP | 2006-321222 | 11/2006 |
| JP | 2008-238462 | 10/2008 |
| JP | 5034593 | 9/2012 |
| TW | I231786 B | 5/2005 |

\* cited by examiner

- - - - Metal 1
———— Metal 2

View A-A from FIG. 1

ALTERNATIVE GROUND LINES FOR INTER-SLOT GROUNDING

BACKGROUND

Die shrink generally refers to reducing the size of a semiconductor die while retaining the same die functionality. A smaller die size benefits semiconductor manufacturing companies by enabling more dies to be produced per wafer of silicon, or other semiconductor such as GaAs, which lowers the cost per die. Smaller die sizes also benefit end-users by reducing power consumption and heat generation in semiconductor devices, which lowers operating costs. Similar cost benefits are achieved in inkjet printing systems by applying die shrink to fluid-jetting, printhead dies. Inkjet printing systems control printhead dies to eject ink onto print media to produce images and text. In addition to semiconductor devices, printhead dies incorporate fluidic structures that can present particular challenges with regard to die shrink.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
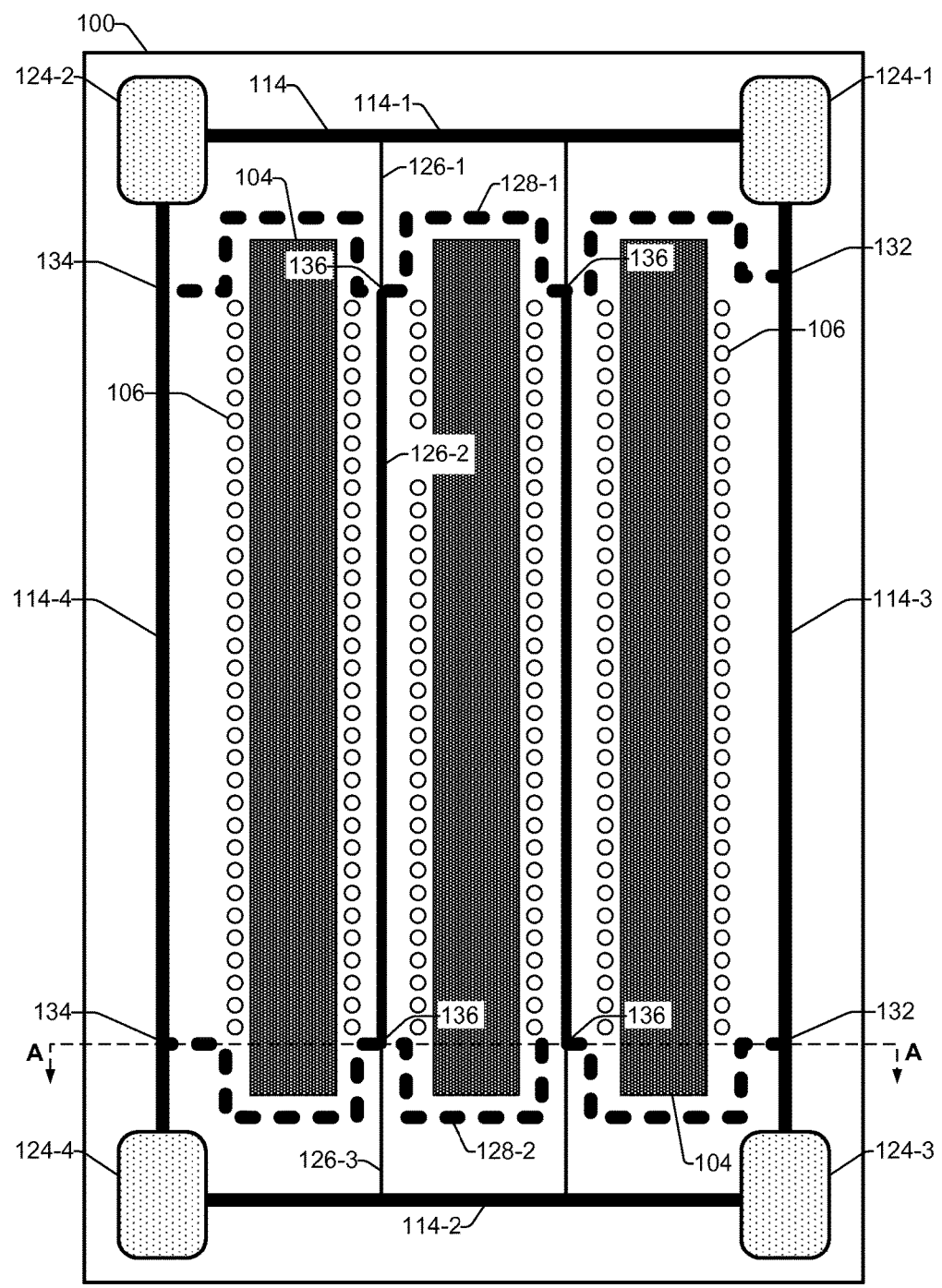
FIG. 1 shows a plan view of an example printhead die incorporating a grounding structure comprising alternative ground lines to improve inter-slot grounding.

As noted above, smaller printhead die sizes achieved through die shrink provide cost savings due to greater die yield per silicon wafer. At the same time, improving printhead die performance often involves design changes that tend to increase the printhead die size. For example, improving printhead die performance often includes designing printhead dies with increasing numbers of fluid ejection nozzles, which increases data storage requirements (e.g., within an EPROM) and routing requirements. Therefore, as printhead die performance continues to be improved, the ability to achieve smaller printhead die sizes that can accommodate growing memory and routing requirements becomes increasingly important.

However, shrinking printhead die sizes presents some challenges that may not be encountered with traditional semiconductor dies. For example, printhead dies include fluidic structures such as fluid slots formed in the dies that can complicate the placement of components and the routing of metal layer power lines, address lines, ground lines, other interconnect lines, and bond pads. In addition, some operational modes (i.e., print modes) create conditions that can strain the performance limits related to such routing on the printhead die. For example, a print mode in which the output is very dark (e.g., full coverage of print media with dark ink) can cause a maximum firing in which all the nozzles in a data group fire at the same time, generating a maximum amount of current to sink through the ground lines. Maintaining sufficient ground lines capable of sinking such large amounts of current while attempting to shrink the printhead die size presents a significant challenge.

Firing nozzles on a thermal inkjet printhead involves heating ink in a fluid chamber. The heat creates a vapor bubble that ejects ink from the chamber and through a nozzle. The heat is generated by applying a high voltage across a thermal resistor within the chamber. The heating process results in a large amount of current, which can reach its maximum when all the nozzle data groups are being fired at the same time. Inter-slot grounding lines running between the fluid slots are intended to drain the current during firing of the inter-slot nozzles. However, decreasing the printhead die size causes smaller slot pitch (slot-to-slot distance), which results in smaller/thinner inter-slot grounding lines toward the end portions of the inter-slot ground lines as they exit from between the fluid slots and enter the heavily congested die areas at the ends of the fluid slots. The areas toward the fluid slot ends can be congested with many fire lines and address lines whose widths remain the same, while the inter-slot grounding line widths are reduced. The thinning of the inter-slot grounding lines reduces their ability to sink current and increases parasitic resistance between bond pads, resulting in inefficient nozzle firing.

Accordingly, example printhead dies described herein provide grounding structures that improve inter-slot grounding and reduce parasitic resistance, which enhances reliability of nozzle firing during maximum nozzle firing conditions when current flow through ground lines is at its highest levels. In some examples, inter-slot ground lines in a metal two layer (M2 layer) are supplemented by alternative ground lines in a metal one layer (M1 layer). While the inter-slot ground lines in the M2 layer continue to carry current to north and south segments of a perimeter ground line, the alternative ground lines in the M1 layer provide alternative ground paths that carry current to east and west segments of the perimeter ground line. The alternative ground lines are coupled to the inter-slot ground line at points near the fluid slot ends where the inter-slot ground line begins to narrow due to die congestion. The alternative ground lines are coupled at their ends to east and west segments of the perimeter ground line, and thereby create alternative ground paths that share the flow of current from the nozzle firings to the perimeter ground line. Therefore, all of the nozzle firing current does not have to squeeze through the narrowed end sections of the inter-slot ground lines, which is especially beneficial during maximum nozzle firings. The alternative ground lines in the M1 layer are coupled to the inter-slot ground lines in the M2 layer through vias that pass through a dielectric layer between the M1 and M2 metal layers.

In an example implementation, a grounding structure includes, in a M2 metal two (M2) layer, a perimeter ground line around the perimeter of a printhead die. The perimeter ground line includes north, south, east, and west segments. Also in the M2 layer, is an inter-slot ground line that extends from the north segment to the south segment between two fluid slots. The grounding structure also includes, in a metal one (M1) layer, an alternative ground line that extends from the east segment to the west segment of the perimeter ground line and intersects the inter-slot ground line through vias in a connection area near ends of the fluid slots.

In another example implementation, a printhead die includes a plurality of fluid slots formed in the die. A perimeter ground line runs around the fluid slots on the perimeter of the die, and an inter-slot ground line runs between two fluid slots and is coupled to north and south segments of the perimeter ground line. First and second alternative ground lines are each coupled at midpoints to an inter-slot ground line, and are coupled at first and second endpoints to east and west segments, respectively, of the perimeter ground line.

In another example, a grounding structure comprises a perimeter ground line around the perimeter of a printhead die. The perimeter ground line has north, south, east, and west segments. The structure includes an inter-slot ground line extending from the north segment to the south segment between two fluid slots, and an alternative ground line extending from the east segment to the west segment and intersecting the inter-slot ground line in a connection area near ends of the fluid slots.

Figure 2:
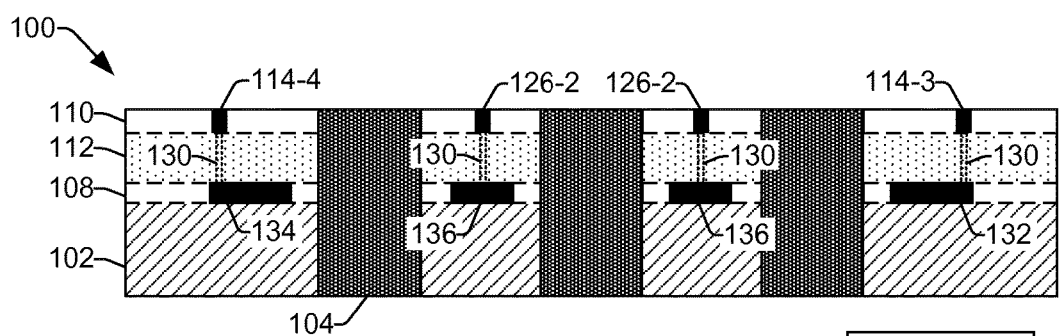
FIG. 2 shows a side view (view A-A) taken from the example printhead die shown in FIG. 1.

FIG. 1 shows a plan view of an example printhead die 100 incorporating a grounding structure comprising alternative ground lines to improve inter-slot grounding. FIG. 2 shows a side view (view A-A) taken from the example printhead die 100 shown in FIG. 1. A printhead die 100 generally comprises a layered architecture with different layers, components, and other features formed using various precision microfabrication and integrated circuit fabrication techniques such as electroforming, laser ablation, anisotropic etching, sputtering, spin coating, dry film lamination, dry etching, photolithography, casting, molding, stamping, machining, and the like.

Referring generally to FIGS. 1 and 2, the layered architecture of a printhead die 100 includes a semiconductor substrate 102 such as a silicon substrate, with one or multiple fluid slots 104 formed therein. While three fluid slots 104 are shown in the example printhead die 100 in FIGS. 1 and 2, in other examples there may be more or less fluid slots 104. Running along either side of each fluid slot 104 are columns of fluid drop ejectors that generally comprise nozzles 106 with associated thermal resistors and fluid chambers (not shown) underlying the nozzles 106. The printhead die 100 can include various layers formed over the substrate 102, including thin-film layers, a primer layer, chamber or barrier layer, and a nozzle layer. Thin-film layers may implement thin film thermal resistors and associated electrical circuitry such as drive circuits, addressing circuits (not shown), and metal routing lines that operate to eject fluid drops from the printhead die 100. Thus, as shown in FIG. 2, printhead die 100 includes a metal 1 (M1) layer 108 (a lower layer), and a metal 2 (M2) layer 110 (an upper layer) formed on substrate 102. Also formed on substrate 102 is a dielectric thin-film layer 112 (a middle layer), located in between the M1 layer 108 and M2 layer 110, to electrically isolate the M1 and M2 layers from each other.

As shown in FIGS. 1 and 2, printhead die 100 includes a perimeter ground line 114 surrounding the fluid slots and running along the perimeter of the die 100. The perimeter ground line 114 is formed in the M2 metal layer 110, and includes four segments that can be referred to as north 114-1, south 114-2, east 114-3, and west 114-4, perimeter ground line segments. The north 114-1, south 114-2, east 114-3, and west 114-4, perimeter ground line segments are coupled together through ground bond pads 124 (illustrated as ground bond pads 124-1, 124-2, 124-3, 124-4). As discussed below with regard to FIG. 3, ground bond pads 124 are coupled to a flexible cable containing traces that electrically connect the printhead die 100 with conductive pads on an integrated print cartridge. The north perimeter ground line segment 114-1 is coupled between an upper right ground bond pad 124-1 and an upper left ground bond pad 124-2. The south perimeter ground line segment 114-2 is coupled between a lower right ground bond pad 124-3 and a lower left ground bond pad 124-4. The east perimeter ground line segment 114-3 is coupled between the upper right ground bond pad 124-1 and lower right ground bond pad 124-3, and the west perimeter ground line segment 114-4 is coupled between the upper left ground bond pad 124-2 and lower left ground bond pad 124-4.

Printhead die 100 also includes an inter-slot ground line 126 (illustrated as sections 126-1, 126-2, 126-3) that runs along each inter-slot region located between fluid slots 104 on the die. Thus, in the example printhead die 100 of FIGS. 1 and 2, there are two inter-slot ground lines 126, one running along each of the two inter-slot regions located between the three fluid slots 104. Inter-slot ground lines are formed in the M2 metal layer 110, and each inter-slot ground line 126 includes a first end section 126-1, a middle section 126-2, and a second end section 126-3. As shown in FIG. 1, the first and second end sections (126-1, 126-3) of the inter-slot ground line extend out from in between the fluid slots 104, and they are thinned by comparison to the middle section 126-2 of the inter-slot ground line which runs in the inter-slot region between the fluid slots 104. As noted above, the thinning of the inter-slot ground line is due to the congestion in the die areas near the ends of the fluid slots 104. The die areas around the ends of the fluid slots 104 are increasingly congested (i.e., due to reduced slot pitch from die shrink) with numerous power lines and address lines (not shown) that provide energy and control for firing the numerous nozzles 106 adjacent to the sides of the fluid slots 104. This congestion results in the thinning of the inter-slot ground line along the first and second end sections 126-1, 126-3, which reduces the ability of these sections to sink current to the perimeter ground line 114. Because there is less congestion in the inter-slot regions between fluid slots 104, the middle section 126-2 of the inter-slot ground line is not thinned.

As shown in FIG. 1, the two ends of inter-sot ground line 126 intersect the perimeter ground line 114. One end of the inter-slot ground line 126 in the first end section 126-1 intersects the north perimeter ground line segment 114-1, and the opposite end of the inter-slot ground line 126 in the second end section 126-3 intersects the south perimeter ground line segment 114-2. Thus, the inter-slot ground line 126 provides a pathway for current to flow from nozzles 106 to the perimeter ground line 114 and off the die through ground bond pads 124. However, as noted above, due to the thinned inter-slot ground line end sections 126-1 and 126-3, the current-carrying ability of the inter-slot ground line through these end sections is diminished.

Referring still to the example of FIGS. 1 and 2, the printhead die 100 also includes two alternative ground lines 128 (illustrated with dashed lines 128-1 and 128-2), each running adjacent to a respective end of the fluid slots 104. That is, a first alternative ground line 128-1 runs near ends of the fluid slots 104 toward the north perimeter ground line segment 114-1, and a second alternative ground line 128-2 runs near ends of the fluid slots 104 toward the south perimeter ground line segment 114-2. The alternative ground lines 128 are formed in the M1 metal layer 108, and each alternative ground line 128 intersects with the M2 metal layer 110 through vias 130 in three places. The alternative ground lines 128 both intersect at first endpoints 132, with the east perimeter ground line segment 114-3 (i.e., in the M2 metal layer 110) through vias 130. The alternative ground lines 128 also both intersect at second endpoints 134, with the west perimeter ground line segment 114-4 (i.e., in the M2 metal layer 110) through vias 130. The alternative ground lines 128 also intersect at their midpoints 136, with the inter-slot ground lines 126 in the M2 metal layer 110.

These intersections are made through vias 130 and connections are made to the inter-slot ground lines 126 near where the middle section 126-2 meets the end sections 126-1 and 126-3. Referring to FIG. 2, while only one via 130 is shown for each connection between ground lines in the M1 metal layer 108 and ground lines in the M2 metal layer 110, in an actual printhead die 110 there is more likely to be multiple vias 130 used for each connection between ground lines in the M1 and M2 layers. The connections of the alternative ground lines 128 between the inter-slot ground lines 126 and the perimeter ground lines 114 create a grounding structure that provides alternative current flow paths to improve the inter-slot grounding and reduce parasitic resistance, which enhances the reliability of nozzle firings, especially during maximum nozzle firing conditions when current flow through ground lines is at its highest levels.

Figure 3:
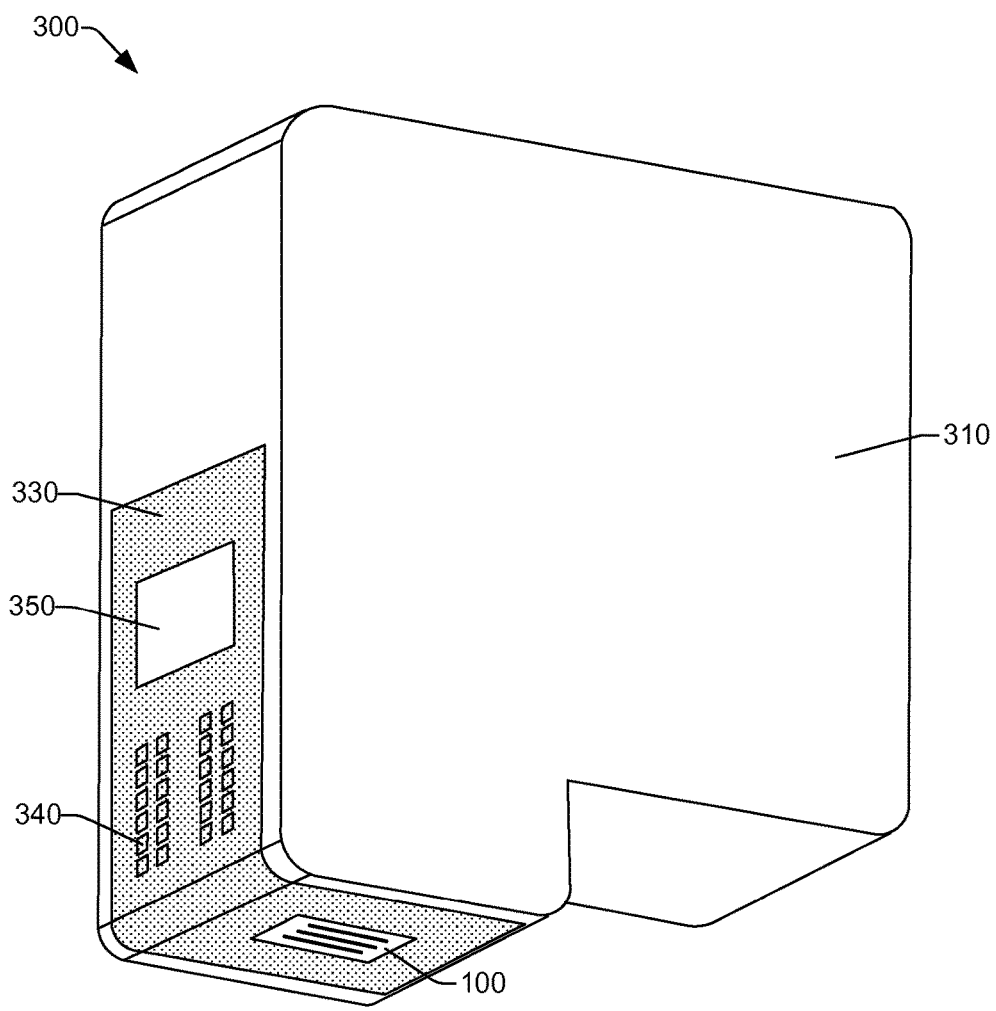
FIG. 3 shows a perspective view of an example integrated print cartridge incorporating a printhead die such as that shown in FIGS. 1 and 2.

FIG. 3 shows a perspective view of an example integrated print cartridge 300 incorporating a printhead die 100 such as that shown in FIGS. 1 and 2. The integrated print cartridge 300 is more generally a fluid-jet precision-dispensing device or fluid ejector structure that precisely dispenses fluid, such as ink. In one example, the integrated print cartridge 300 illustrated in FIG. 3 may be a single color ink cartridge for a fluid-jet printer. However, in some examples, the integrated print cartridge 300 may be implemented in any of a variety of fluid cartridges or printheads with an on-board memory.

While the present description generally describes an inkjet printing cartridge that ejects ink onto media, other examples may not be limited to only inkjet printing cartridges and associated devices. In general, appropriate examples can include any type of fluid-jet precision-dispensing or ejection devices that dispense a fluid. As used herein, the term fluid is meant to be broadly interpreted as any substance that deforms under an applied force. Examples of fluids include liquids and gases. A fluid-jet precision dispensing device is a device in which printing or dispensing of a fluid is achieved by precisely printing or dispensing the fluid in accurately specified locations, for example, onto print media. For purposes of this description, therefore, a print cartridge or ink cartridge will be described. However, it will be understood that any type of fluid or liquid cartridge may be used with the principles described herein.

According to one example, the integrated print cartridge 300 is comprised of an ink reservoir 310, a printhead die 100, a flexible cable 330, conductive pads 340, and an integrated circuit 350. The flexible cable 330 is adhered to two sides of the print cartridge 300 and contains traces that electrically connect the integrated circuit 350 and printhead die 100 with the conductive pads 340.

The integrated print cartridge 300 is installed into a cradle that is integral to the carriage of a printer. When the integrated print cartridge 300 is correctly installed, the conductive pads 340 are pressed against corresponding electrical contacts in the cradle, allowing the printer to communicate with, and control the electrical functions of, the integrated print cartridge 300. For example, the conductive pads 340 allow the printer to access and write to the integrated circuit 350, and to control fluid dispensing from printhead die 100.

The integrated circuit 350 may comprise an EPROM (Erasable Programmable Read-Only memory) that contains a variety of information including the type of ink cartridge, the kind of ink contained in the cartridge, an estimate of the amount of ink remaining in the ink reservoir 310, calibration data, error information, the identification of the integrated printhead, an analog serial number, and security features, among others. The printer can take appropriate action based on the information contained in the ink integrated circuit 350, such as notifying the user that the ink supply is low, or altering printing modes to maintain image quality. In the illustrated example, the integrated circuit 350 is shown as a separate element that is distinct from the printhead die 100. However, in some examples, the printhead die 100 may contain the integrated circuit 350 memory in addition to the nozzles and other physical elements used to dispense the ink.

To create an image, the printer moves the carriage containing the integrated print cartridge 300 over a piece of print medium. At appropriate times, the printer sends electrical signals to the print cartridge 300 via the electrical contacts in the cradle. The electrical signals pass through the conductive pads 340 and are routed through the flexible cable 330 to the printhead die 100. The printhead die 100 then ejects a small droplet of ink from the reservoir 310 onto the surface of the print medium. These droplets combine to form an image on the print medium surface.

What is claimed is:

1. A grounding structure comprising:
   in a metal two layer:
   a perimeter ground line around the perimeter of a printhead die, having north, south, east, and west segments;
   an inter-slot ground line extending from the north segment to the south segment between two fluid slots;
   in a metal one layer:
   an alternative ground line extending from the east segment to the west segment and intersecting the inter-slot ground line in a connection area near ends of the fluid slots.

2. A grounding structure as in claim 1, further comprising:
   a dielectric layer between the metal two layer and metal one layer; and
   vias extending through the dielectric layer to connect the alternative ground line with the inter-slot ground line and the east and west segments.

3. A grounding structure as in claim 1, further comprising:
   bond pads coupling the north and south segments to the east and west segments to form the perimeter ground line.

4. A grounding structure as in claim 1, wherein the bond pads comprise four bond pads, one bond pad in each of four corners of the printhead die, and wherein:
   the north segment is coupled between two bond pads located in upper corners of the printhead die;
   the south segment is coupled between two bond pads located in lower corners of the printhead die;
   the west segment is coupled between two bond pads located in left corners of the printhead die; and
   the east segment is coupled between two bond pads located in right corners of the printhead die.

5. A grounding structure as in claim 1, wherein the inter-slot ground line comprises a middle section within an inter-slot region between the two fluid slots, a first end section extending from the north segment to the middle section, and a second end section extending from the south segment to the middle section, and wherein the end sections are thinner than the middle section.

6. A grounding structure as in claim 5, wherein the alternative ground line intersects the inter-slot ground line where the normal section and thinned section meet.

7. A grounding structure as in claim 1, wherein the alternative ground line comprises two alternative ground lines, each alternative ground line extending from the east segment to the west segment, one of the two alternative ground lines running adjacent to fluid slot ends toward the north segment, and another of the two alternative ground lines running adjacent to fluid slot ends toward the south segment.

8. A printhead die comprising:
a plurality of fluid slots formed in a die;
a perimeter ground line running around the fluid slots on the perimeter of the die;
an inter-slot ground line running between two fluid slots and coupled to north and south segments of the perimeter ground line; and
first and second alternative ground lines, each coupled at midpoints to an inter-slot ground line, and at first and second endpoints to east and west segments, respectively, of the perimeter ground line.

9. A printhead die as in claim 8, further comprising:
an upper and lower metal layer formed on the die and separated by a middle dielectric layer, wherein the upper layer comprises the perimeter ground line and inter-slot ground line, and the lower layer comprises the alternative ground lines.

10. A printhead die as in claim 9, further comprising:
vias formed through the dielectric layer to join the alternative ground lines in the lower layer with the perimeter ground line and inter-slot ground lines in the upper layer.

11. A printhead die as in claim 8, wherein the first alternative ground line runs past first ends of the fluid slots and the second alternative ground line runs past second ends of the fluid slots.

12. A grounding structure comprising:
a perimeter ground line around the perimeter of a printhead die, having north, south, east, and west segments;
an inter-slot ground line extending from the north segment to the south segment between two fluid slots; and
an alternative ground line extending from the east segment to the west segment and intersecting the inter-slot ground line in a connection area near ends of the fluid slots.

13. A grounding structure as in claim 12, further comprising:
a metal one layer;
a metal two layer; and
a dielectric layer between the metal one layer and the metal two layer.

14. A grounding structure as in claim 13, wherein:
the metal two layer comprises the perimeter ground line and the inter-slot ground line; and
the metal one layer comprises the alternative ground line.

15. A grounding structure as in claim 14, further comprising vias formed through the dielectric layer and connecting the alternative ground line to the east segment, the west segment, and the inter-slot ground line.

* * * * *